(12) United States Patent
Luhr et al.

(10) Patent No.: US 9,335,205 B2
(45) Date of Patent: May 10, 2016

(54) CONTROL DEVICE

(75) Inventors: Volker Luhr, Markgroeningen (DE);
Matthias Faas, Oberstenfeld (DE);
Hamed Feridouni, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 539 days.

(21) Appl. No.: 13/876,645

(22) PCT Filed: Sep. 16, 2011

(86) PCT No.: PCT/EP2011/066091
§ 371 (c)(1),
(2), (4) Date: Mar. 28, 2013

(87) PCT Pub. No.: WO2012/052233
PCT Pub. Date: Apr. 26, 2012

(65) Prior Publication Data
US 2013/0186204 A1   Jul. 25, 2013

(30) Foreign Application Priority Data
Sep. 28, 2010  (DE) .................. 10 2010 041 540

(51) Int. Cl.
*G01H 17/00* (2006.01)
*H05K 5/02* (2006.01)
*H05K 5/00* (2006.01)

(52) U.S. Cl.
CPC ............. *G01H 17/00* (2013.01); *H05K 5/0047* (2013.01); *H05K 5/0056* (2013.01); *H05K 5/0069* (2013.01); *H05K 5/0078* (2013.01)

(58) Field of Classification Search
CPC . H05K 5/0056; H05K 5/0052; H05K 5/0047; H05K 5/0069; H05K 5/0078; H05K 5/0221; H05K 5/0217; G01H 17/00
See application file for complete search history.

(56) References Cited

U.S. PATENT DOCUMENTS 5,473,109 A * 12/1995 Plankl .................. H05K 5/0047
174/363
5,842,892 A * 12/1998 Heimueller ........ H01R 13/4364
439/752

(Continued)

FOREIGN PATENT DOCUMENTS

CN    1248207    3/2000
CN    1544738    11/2004

(Continued)

OTHER PUBLICATIONS

English Language Machine Translation of DE 19755767. Translattion Date: Sep. 28, 2015.*

(Continued)

*Primary Examiner* — Lisa Caputo
*Assistant Examiner* — Punam Roy
(74) *Attorney, Agent, or Firm* — Michael Best & Friedrich LLP

(57) ABSTRACT

The invention relates to a control device comprising a housing (2) with a first housing part (20) and a second housing part (21), a printed circuit board (3) arranged in the housing (2), a plug element (4) which has a plurality of contacts (40) and is connected to the printed circuit board (3) both mechanically and electrically, and a vibration-sensitive sensor, wherein the plug element (4) is firmly connected to one of the housing parts (20, 21) by means of a mechanical connection (5), wherein the mechanical connection (5) has a protruding element (50) and a receiving element (51) with a recess (7) for receiving the protruding element (50), wherein the recess (7) has a base region (9), a first wall region (10) and a second wall region (30), and wherein a first rib (11) is arranged on the first wall region (10) and a second rib (12) is arranged on the second wall region (30).

19 Claims, 3 Drawing Sheets

(56) References Cited

U.S. PATENT DOCUMENTS

| | | | | |
|---|---|---|---|---|
| 6,485,336 | B1* | 11/2002 | Zebermann | H05K 7/1455 439/677 |
| 8,575,480 | B2* | 11/2013 | Young | H05K 5/0069 174/50 |
| 2004/0023548 | A1* | 2/2004 | Noro | H01R 13/6271 439/353 |
| 2011/0235290 | A1* | 9/2011 | Luhr | H05K 3/301 361/752 |
| 2014/0060918 | A1* | 3/2014 | Kushima | H02K 5/24 174/520 |
| 2014/0138121 | A1* | 5/2014 | Blazic | H01B 5/16 174/135 |
| 2014/0176130 | A1* | 6/2014 | Bueno Palacios | G01B 7/30 324/207.25 |
| 2014/0285987 | A1* | 9/2014 | Nagashima | H05K 7/12 361/759 |

FOREIGN PATENT DOCUMENTS

| | | |
|---|---|---|
| DE | 432048 | 7/1926 |
| DE | 4232048 | 3/1994 |
| DE | 19755767 | 6/1999 |
| DE | 102006006078 | 9/2007 |
| EP | 1341263 | 9/2003 |
| FR | 2063839 | 7/1971 |
| WO | 93/13963 | 7/1993 |

OTHER PUBLICATIONS

International Search Report for Application No. PCT/EP2011/066091 dated Feb. 3, 2012 (2 pages).

* cited by examiner

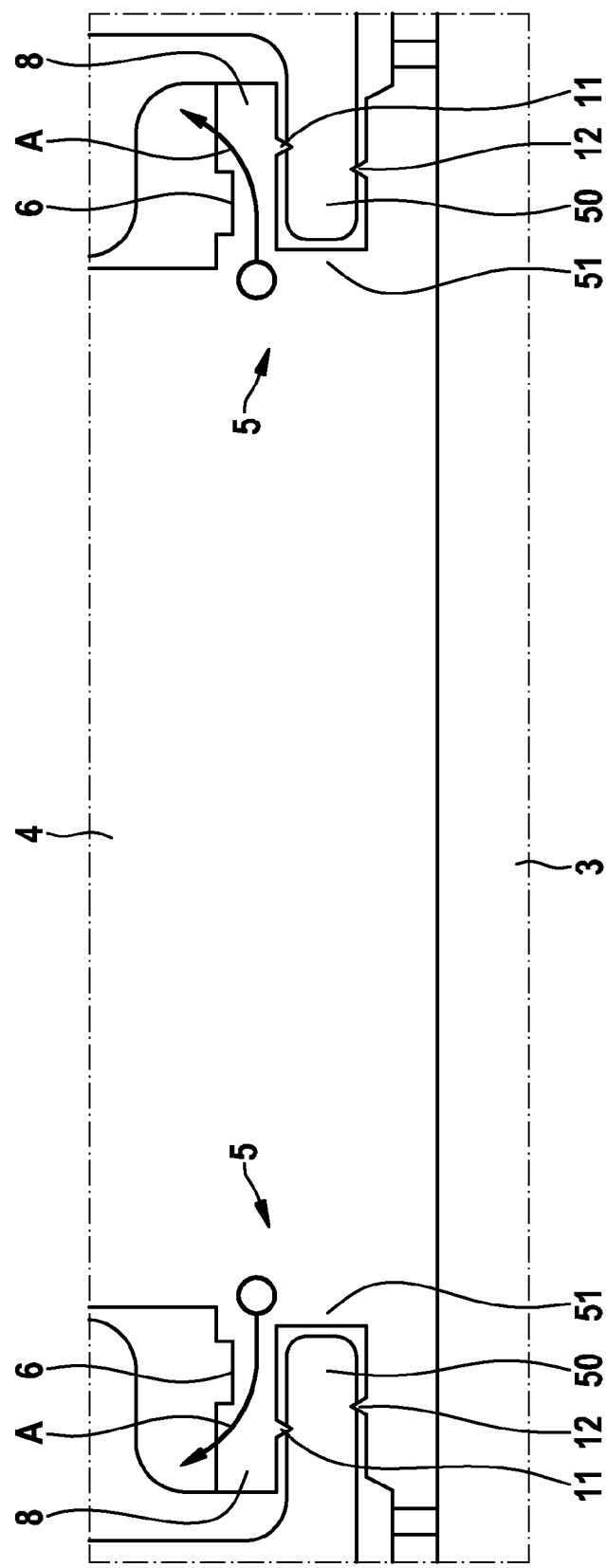

CONTROL DEVICE

BACKGROUND OF THE INVENTION

The present invention relates to a control device, in particular a control device comprising a sensor, which device is used in motor vehicles.

Control devices of the prior art substantially consist of a printed circuit board comprising a plug element, said printed circuit board being fixed in a housing. Such a control device is known from the German patent publication DE 10 2006 078 B4, in which the plug element together with the printed circuit board is snap-locked to the housing. The German patent publication DE 42 32 048 C2 discloses a control device, the plug element of which together with the printed circuit board is clamped between two housing parts. Due to the tolerances in the installed state, the plug element and the housing can hit up against each other or respectively rattle as a result of vibrations during operation, whereby the function of the control device is impaired.

SUMMARY OF THE INVENTION

The control device according to the invention has in contrast the advantage that the plug housing is firmly connected to a housing part by means of a mechanical connection, which prevents adjacent parts from hitting up against each other or rattling and the malfunctions of the control device resulting therefrom. According to the invention, this is achieved by virtue of the fact that the mechanical connection between the housing part and the plug element has a protruding element and a receiving element with a recess for receiving the protruding element. In so doing, the recess comprises a base region, a first wall region and a second wall region, wherein a first rib is arranged on the first wall region and a second rib is arranged on the second wall region. This facilitates an enduringly stable, vibration resistant and easily fitted mounting of the plug element to the housing part as well as a time and cost efficient manufacturing of the entire control device. It is furthermore hereby possible to integrate a vibration-sensitive sensor into the control device, a danger of a malfunction resulting from vibrations or the like of the housing and/or the plug element being thereby eliminated.

According to one preferred embodiment of the invention, at least one of the wall regions is formed by a limb, and a slot is arranged on an exterior side of the limb. As a result of this design, an elastic deformation of the limb is facilitated without requiring a great deal of force when inserting the plug element into the housing part. In addition, a force-fitting attachment due to the spring function of the limb is thus provided, which ensures a permanent contact with a high degree of durability for each tolerance position. The printed circuit board together with the plug element can furthermore be easily connected to the housing parts without generating tensions between contacts of the plug element and the printed circuit board.

It is furthermore preferred for the first rib to be disposed offset to the second rib as seen in the longitudinal direction of the recess. The ribs comprise further in a preferred manner an end in the shape of a cutting edge. As a result of the contact which is offset and linearly designed, an improved guidance as well as force distribution is ensured between the protruding element and the receiving element. In addition, a mutual twisting or tipping of the components when being mechanical attached is prevented during assembly.

In a further advantageous embodiment of the invention, the sensor is a yaw-rate sensor and/or an acceleration sensor for detecting the yaw rate and/or the acceleration of the motor vehicle in one or a plurality of axial directions. By means of the positively locking and force-fitting mechanical connection between housing and plug element, malfunctions in vibration control during vehicle operation are reliably suppressed and thus a sensor function in the control device which is continuously reliable during operation is ensured.

In a preferred manner, a plurality of ribs is disposed in each case parallel to one another on each of the wall regions. It is additionally preferred for the ribs to run perpendicularly to the longitudinal direction of the recess. In so doing, an improved force distribution with a workload per rib that is reduced corresponding to the number of ribs can be provided in the mechanical connection.

In a further advantageous embodiment of the invention, a plurality of mechanical connections is provided between the plug element and the housing part. In a further preferred manner, each of the housing parts is connected to the plug element via a mechanical connection. Hence, a reliable and rattle-free mounting of the plug element is facilitated which provides permanent contact between said plug element and one of the two housing parts, said mounting being also able to withstand high vibration stresses during operation of the motor vehicle.

BRIEF DESCRIPTION OF THE DRAWINGS

An exemplary embodiment of the invention is described below in detail with reference to the accompanying drawings. In the drawings:

FIG. 4 shows a further depiction of the mechanical connection.

DETAILED DESCRIPTION

According to a preferred exemplary embodiment of the invention, a control device 1 is described below in detail with reference to FIGS. 1 to 4.

Figure 1:
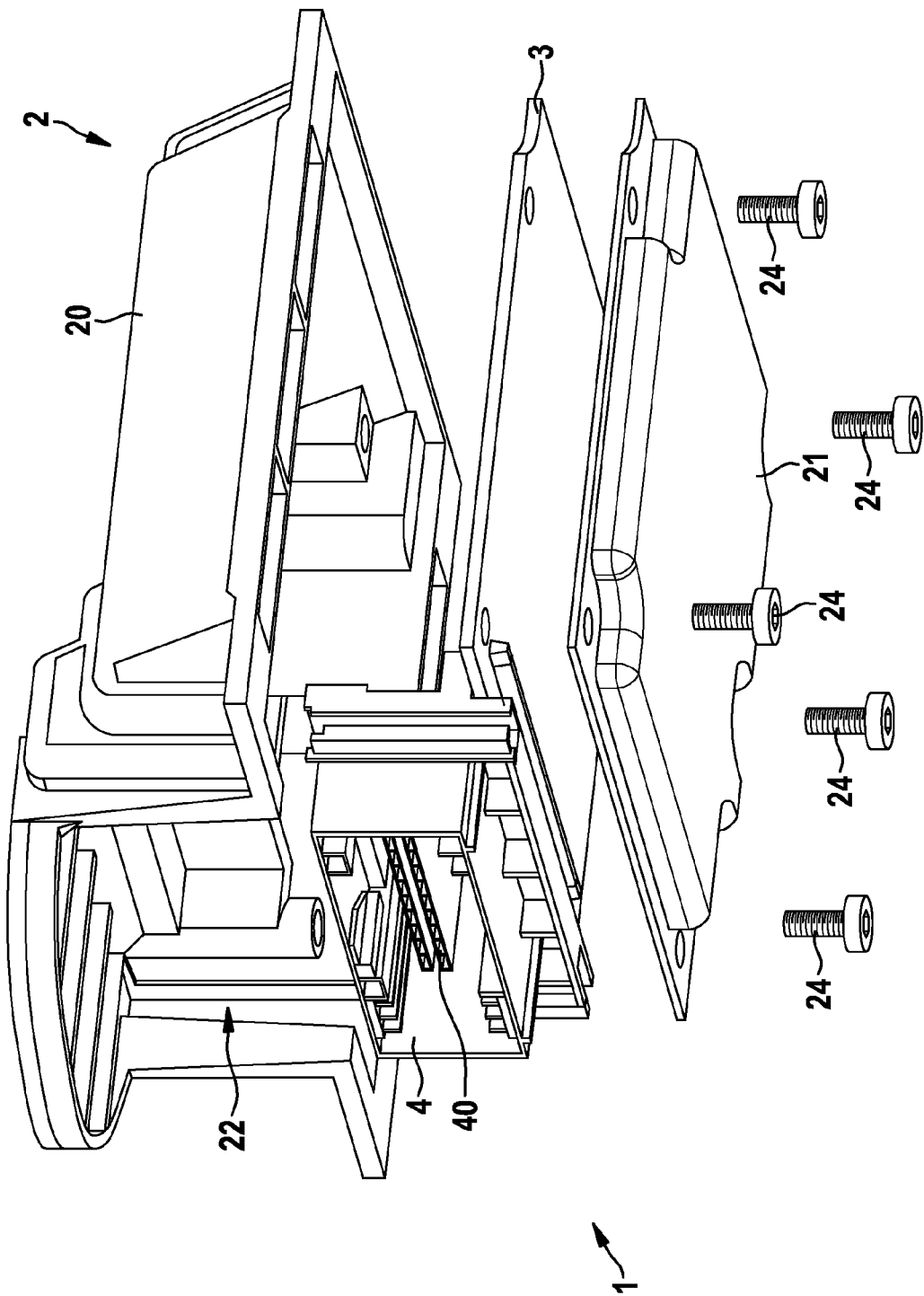
FIG. 1 shows a perspective view of the control device according to the invention.

FIG. 1 shows a perspective view of a control device 1 according to a preferred exemplary embodiment of the invention, in which the individual component parts are depicted spaced apart from one another for better clarity. As can be seen in FIG. 1, the control device 1 comprises a housing 2 with a first housing part 20 and a second housing part 21 as well as a printed circuit board 3 disposed between said two housing parts. The printed circuit board 3 is connected mechanically as well as electrically to a plug element 4 comprising a plurality of contacts 40. The component assembly comprising the printed circuit board 3 and the plug element 4 is then connected to a housing part by means of a mechanical connection 5.

Figure 2:
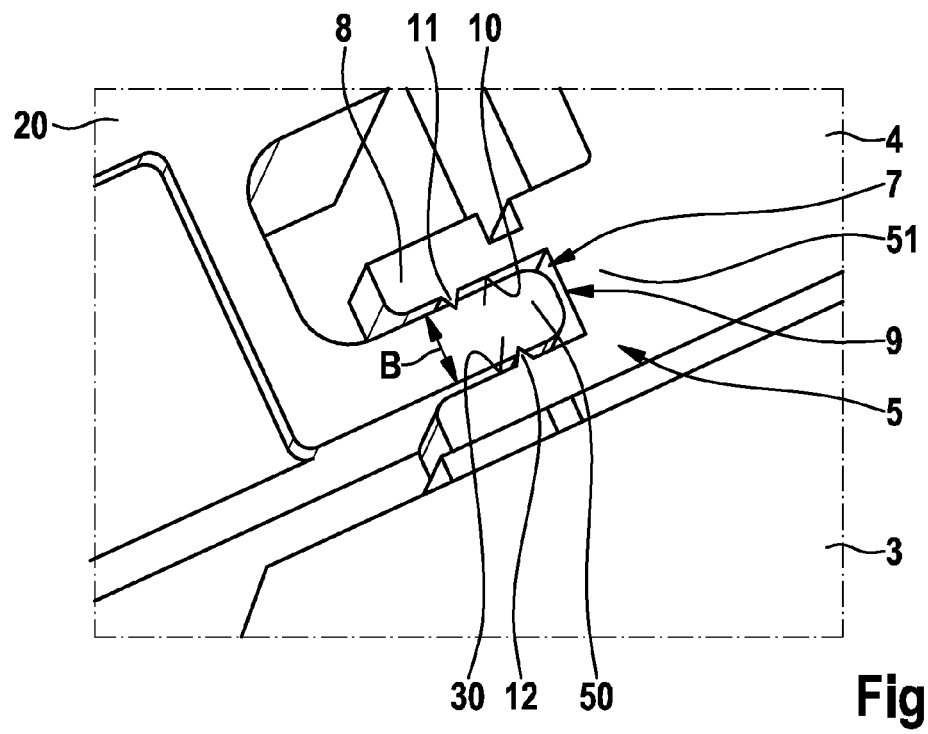
FIG. 2 shows a depiction of the mechanical connection between plug element and housing part of the control device of FIG. 1.

As can be seen in the enlarged view of FIG. 2, the mechanical connection 5 has a protruding element 50 having a width B, which is configured on the first housing part 20, as well as a receiving element 51 having a recess 7, which is configured on the plug element 4. The protruding element 50 is received in the recess 7. Said recess 7 has a base region 9, a first wall region 10 and a second wall region 30. A protruding first rib 11 is arranged on the first wall region 10 of said recess 7 and a protruding second rib 12 is arranged on the second wall region of said recess 7.

Figure 3:
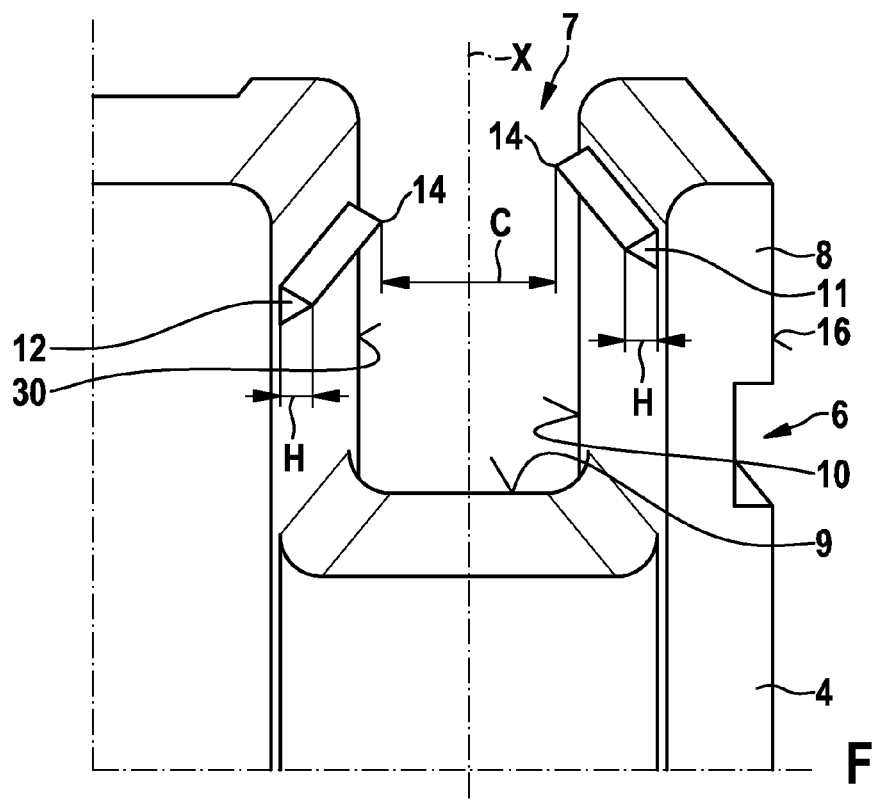
FIG. 3 shows an enlarged view of the mechanical connection of FIG. 2.

As can be seen in FIG. 3, the first rib 11 is furthermore disposed offset with respect to the second rib 12 as viewed in the longitudinal direction X-X of the recess 7. In addition, the first and second ribs 11, 12 have in each case an end in the shape of a cutting edge. Due to the ends 14 shaped like cutting edges of the first and second ribs 11, 12, a linearly shaped, positively locking contact is provided between the protruding element 50 and the receiving element 51. As an alternative, a plurality of ribs 11 can also in each case be disposed parallel to one another on each wall region 10, 30 of the recess 7. As can further be seen in FIG. 3, the wall region 10 is formed by a limb 8, and a slot 6 is disposed on an exterior side 16 of the limb 8. The cross-section of the limb 8 is reduced by the slot 6, and therefore the elastic deformation of said limb can occur with less force. In this way, a resilient limb 8 is formed. The first and second ribs 11, 12 protrude in each case with a height H out of the first wall region 10 or respectively the second wall region of the recess 7. In so doing, the heights H are dimensioned such that the width B (see FIG. 2) of the protruding element 50 is configured somewhat larger than a remaining opening dimension C of the recess 7 of the receiving element 51.

During assembly of the control device 1, the plug element 4 together with the printed circuit board 3 is initially inserted into a cut-out 22 of the first housing part 20 using pressing equipment and is connected to the same by means of the mechanical connection 5 (see FIG. 2). After removing the pressing equipment, the second housing part 21 is subsequently positioned on the plug element 4 and the first housing part 20 and is fastened to said plug element 4 and said first housing part 20 using self-tapping screws 24. Furthermore, a yaw-rate and/or acceleration sensor, which is not visibly depicted in FIG. 1, for detecting the yaw rate and/or acceleration of the vehicle is disposed in the control device 1. Although not depicted in the figures, a plurality of mechanical connections 5 can alternatively be provided between the plug element 4 and the housing part 20. In addition, said first housing part 20 as well as said second housing part 21 can be connected to the plug element 4 by means of the mechanical connection 5.

During assembly of the control device 1, a defined force is applied when inserting the protruding element 50 and the receiving element 51 of the mechanical connection 5 using the pressing equipment. By means of this application of force, the limb 8 of the receiving element 51, as depicted in FIG. 4, is elastically, or respectively resiliently, bent up in the direction of arrow A and therefore brings about, aside from the positive locking contact, an additional form-fitting contact between the protruding element 50 and the receiving element 51 of the mechanical connection. In so doing, all tolerances of the mechanical connection 5 are dimensioned in such a way that an enduringly stable, firm mounting of the plug element 4 to the housing 2 is ensured.

According to the invention, a control device 1, in particular for use in motor vehicles, is provided which ensures a permanently reliable contact between the plug element 4 and the housing 2 by means of the inventive embodiment of the mechanical connection 5. A rattling of components hitting up against each other as well as the resulting malfunctions or disturbances can thereby be prevented in control devices having integrated vibration-sensitive sensors.

What is claimed is:

1. A control device comprising:
    a housing (2) with a first housing part (20) and a second housing part (21),
    a printed circuit board (3) arranged in the housing (2),
    a plug element (4) comprising a plurality of contacts (40), which is connected both mechanically and electrically to the printed circuit board (3), and
    a vibration-sensitive sensor,
    wherein the plug element (4) is firmly connected to the first housing part by means of a mechanical connection (5),
    wherein the mechanical connection (5) has a protruding element (50) and a receiving element (51) with a recess (7) for receiving the protruding element (50),
    wherein the recess (7) has a base region (9), a first wall region (10) and a second wall region (30) and
    wherein a first rib (11) projects into the recess (7) from the first wall region (10) and a second rib (12) projects into the recess (7) from the second wall region (30),
    wherein a first height (H) is defined between the first wall region (10) and an outer end (14) of the first rib (11) and a second height (H) is defined between the second wall region (30) and an outer end (14) of the second rib (12),
    wherein the first height (H) and the second height (H) are dimensioned such that a width (B) of the protruding element (50) is larger than a remaining opening dimension (C) of the recess (7) between the outer end (14) of the first rib (11) and the outer end (14) of the second rib (14),
    wherein at least one of the first wall region (10) and the second wall region (30) is formed by a resilient limb (8), and
    wherein a slot (6) is arranged on a side of the resilient limb (8) and reduces the cross-section of the limb (8) so that elastic deformation of the resilient limb (8) occurs with less force.

2. The control device according to claim 1, characterized in that the first rib (11) is disposed offset with respect to the second rib (12) as viewed in a longitudinal direction (X-X) of the recess (7).

3. The control device according to claim 2, characterized in that the sensor is at least one of a yaw-rate sensor and an acceleration sensor.

4. The control device according to claim 1, characterized in that the sensor is at least one of a yaw-rate sensor and an acceleration sensor.

5. The control device according to claim 1, characterized in that the outer end (14) of each of the first rib and the second rib is in the shape of a cutting edge.

6. The control device according to claim 5, characterized in that the protruding element (50) extends into the recess (7) such that an end of the protruding element (50) is adjacent to the base region (9), and wherein a linearly shaped positively locking contact is provided between the protruding element (50) and the receiving element (51) due to the outer end (14) of each of the first rib (11) and the second rib (12) being in the shape of a cutting edge.

7. The control device according to claim 1, characterized in that a plurality of ribs (11, 12) is disposed in each case parallel to one another on each wall region (10, 30) of the recess (7).

8. The control device according to claim 1, characterized in that each of the first rib and the second rib runs perpendicularly to a longitudinal direction of the recess (7).

9. The control device according to claim 1, characterized in that a plurality of mechanical connections (5) is provided between the plug element (4) and the first housing part.

10. The control device according to claim 1, characterized in that each of the first housing part and a second housing part is connected to the plug element (4) by means of a mechanical connection (5).

11. The control device according to claim 3, characterized in that the outer end (14) of each of the first rib and the second rib is in the shape of a cutting edge.

12. The control device according to claim 11, characterized in that a plurality of ribs (11, 12) is disposed in each case parallel to one another on each wall region (10, 30) of the recess (7).

13. The control device according to claim 12, characterized in that each of the first rib and the second rib runs perpendicularly to a longitudinal direction of the recess (7).

14. The control device according to claim 13, characterized in that a plurality of mechanical connections (5) is provided between the plug element (4) and the first housing part.

15. The control device according to claim 14, characterized in that each of the first housing part and a second housing part is connected to the plug element (4) by means of a mechanical connection (5).

16. The control device according to claim 1, characterized in that the slot (6) is arranged on an exterior side (16) of the resilient limb (8) opposite the recess (7).

17. The control device according to claim 1, characterized in that the recess (7) is configured on the plug element (4) and the protruding element (50) is configured on the first housing part.

18. The control device according to claim 1, characterized in that each of the first rib (11) and the second rib (12) are triangularly shaped in cross section such that the outer end (14) of each of the first rib (11) and the second rib (12) define a cutting edge.

19. The control device according to claim 1, characterized in that the resilient limb (8) extends in a direction parallel to an insertion direction of the protruding element (50) into the recess (7) and extends opposite to the insertion direction.

\* \* \* \* \*